(12) United States Patent
Giewont et al.

(10) Patent No.: US 6,388,327 B1
(45) Date of Patent: May 14, 2002

(54) CAPPING LAYER FOR IMPROVED SILICIDE FORMATION IN NARROW SEMICONDUCTOR STRUCTURES

(75) Inventors: Kenneth J. Giewont, Hopewell Junction; Stephen Bruce Brodsky, Wappingers Falls; Cyril Cabral, Jr., Ossining; Anthony G. Domenicucci, New Paltz; Craig Mitchell Ransom, Hopewell Junction; Yun-Yu Wang, Poughquag; Horatio S. Wildman; Kwong Hon Wong, both of Wappingers Falls, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/756,938

(22) Filed: Jan. 9, 2001

(51) Int. Cl.⁷ .................. H01L 23/48; H01L 23/52; H01L 29/40
(52) U.S. Cl. .................. 257/754; 257/751; 257/758
(58) Field of Search ................ 257/754, 757, 257/751; 438/648

(56) References Cited

U.S. PATENT DOCUMENTS

| 5,403,779 A | 4/1995 | Joshi et al. |
| 5,608,266 A | 3/1997 | Agnello et al. |
| 5,624,869 A | 4/1997 | Agnello et al. |
| 5,874,342 A * | 2/1999 | Tsai et al. ................ 438/301 |
| 5,902,129 A * | 5/1999 | Yoshikawa et al. ........ 438/592 |
| 5,970,370 A * | 10/1999 | Besser et al. ............. 438/586 |
| 5,989,988 A | 11/1999 | Iinuma et al. |
| 6,060,387 A | 5/2000 | Shepela et al. |
| 6,063,677 A | 5/2000 | Rodder et al. |
| 6,063,681 A | 5/2000 | Son |
| 6,072,222 A | 6/2000 | Nistler |
| 6,080,648 A | 6/2000 | Nagashima |
| 6,136,705 A * | 10/2000 | Blair ....................... 438/682 |

FOREIGN PATENT DOCUMENTS

GB 2 247 349 A 2/1992

* cited by examiner

*Primary Examiner*—Vu A. Le
*Assistant Examiner*—Brad Smith
(74) *Attorney, Agent, or Firm*—Jay H. Anderson

(57) ABSTRACT

A capping layer for a semiconductor structure is described. The capping layer is deposited over a silicide-forming metal and has a composition such that nitrogen diffusion therefrom is insufficient to cause formation of an oxynitride from an oxide layer on the underlying silicon. The capping layer may be a metal layer from which no N diffusion occurs, or one or more layers including Ti and/or TiN arranged so that N atoms do not reach the oxide layer. A method is also described for forming the Ti and TiN layers. It is advantageous to deposit non-stoichiometric TiN deficient in N, by sputtering from a Ti target in a nitrogen flow insufficient to cause formation of a nitride on the target.

6 Claims, 4 Drawing Sheets

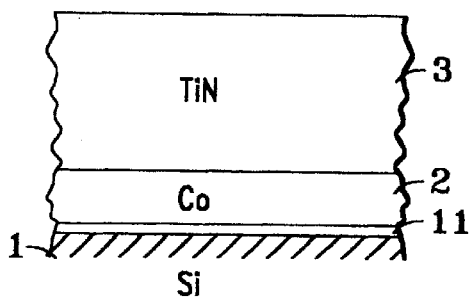
FIG. 3A
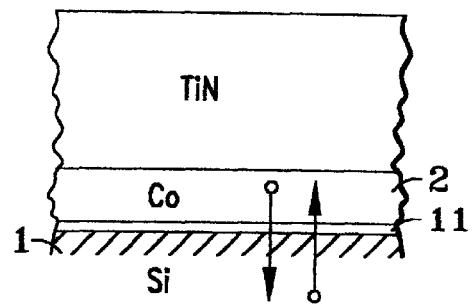
FIG. 3B
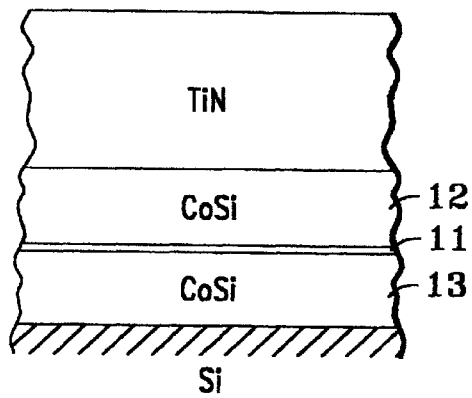
FIG. 3C
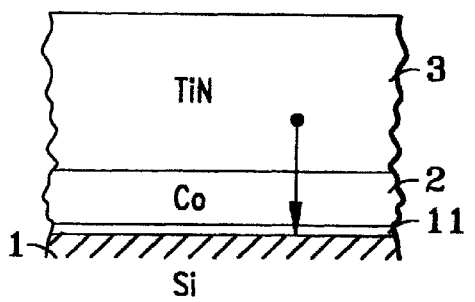
FIG. 4A
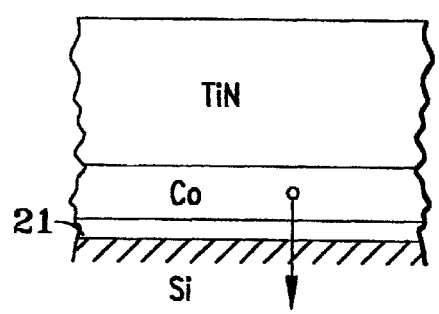
FIG. 4B
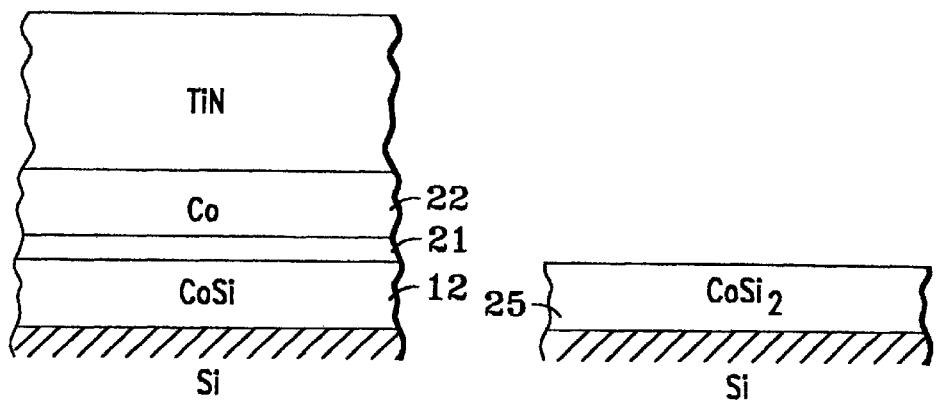
FIG. 4C
FIG. 4D

CAPPING LAYER FOR IMPROVED SILICIDE FORMATION IN NARROW SEMICONDUCTOR STRUCTURES

FIELD OF THE INVENTION

This invention relates to semiconductor devices and manufacturing processes therefor, and more particularly to reduction of resistance in narrow structures in FET devices.

BACKGROUND OF THE INVENTION

In the manufacture of FET devices with polysilicon gates, the ongoing reduction in size of the gates has led to increased resistance of the gate conductor. To overcome this problem, a silicide layer (typically $CoSi_2$) is often placed on top of the polysilicon. The addition of the silicide to the narrow polysilicon gate conductor has been shown to be effective in reducing the resistance. In addition, it is known that forming a $CoSi_2$ layer on other active regions (the source and drain, adjacent to the gate) has a beneficial effect by reducing sheet resistance in those regions. Processes for forming the silicide in a self-aligned fashion are known in the art.

Formation of a cobalt silicide on the gate conductor typically begins with deposition of a Co layer on top of the polysilicon. To prevent oxidation of the cobalt, a capping layer is generally used. Titanium nitride (TiN) is an effective capping layer, serving as an oxygen barrier with good adhesion to the cobalt, while not reacting with the underlying silicon. A typical silicide formation process is shown in FIGS. 1A to 1C. A standard precleaning is performed before deposition to minimize native oxide on the Si surface. As shown in FIG. 1A, the silicon gate structure 1 has a cobalt layer 2 deposited thereon; the thickness of the Co layer 2 is about 80 Å.

A TiN capping layer 3 is then deposited on the cobalt; this conventionally is done by sputtering a Ti target using Ar atoms, in a nitrogen atmosphere. Those skilled in the art will appreciate that as the $N_2$ flow is varied, the target voltage (the voltage between the Ti target and ground) may be measured as a dependent variable. A graph of this relationship is shown in FIG. 2. Details of the plot of target voltage vs. $N_2$ flow will, of course, vary with process conditions and between sputtering tools; the voltages and flowrates shown in FIG. 2 are examples only. There are three distinct regions of $N_2$ flow, indicated by I, II and III in FIG. 2:

I. "Non-nitrided" target: too little $N_2$ is present in the sputtering chamber to form a nitride on the Ti target. Accordingly, pure Ti is sputtered from the target. The Ti may react with N in the chamber to form $Ti_xN_y$ (that is, non-stoichiometric TiN) or Ti(N) (that is, Ti with N in solution). The Co surface thus is coated either with pure Ti (which may later react to form TiN), $Ti_xN_y$ or Ti(N).

II. Transition region: this region is characterized by plasma instabilities, and is avoided in practice because of the difficulty of controlling the sputtering process.

III. "Nitrided" target: sufficient $N_2$ is present to form a nitride, $Ti_xN_y$, on the target. The stoichiometry of the nitride formed on the target depends on the $N_2$ flow actually used. Sputtering this TiN results in grains of TiN being formed on the Si surface; the nitrogen content of the TiN may be further enhanced by the inclusion of N atoms at the grain boundaries. A conventional TiN layer is produced by sputtering in this region of $N_2$ flow.

It follows that TiN produced with $N_2$ flow in region III may be characterized as "N-rich" while TiN produced with $N_2$ flow in region I may be characterized as "N-deficient."

In the conventional TiN capping layer process, the thickness of the TiN layer is about 200 Å. The Si/Co/TiN structure is then annealed in an inert atmosphere (often $N_2$ or Ar) at a temperature approximately in the range 480° C. to 570° C., preferably about 540° C. This annealing step causes the cobalt to react with the silicon to produce a layer 4 of cobalt silicide, CoSi, in place of the Co layer (FIG. 1B). If the Co layer 2 is about 80 Å thick, the thickness of the CoSi layer is generally 200 Å to 300 Å thick. The TiN capping layer may then be stripped away (typically using a sulfuric acid-hydrogen peroxide mixture). A second anneal, at a temperature approximately in the range 680° C. to 750° C., results in formation of a layer 5 of cobalt disilicide on the Si gate 1 (FIG. 1C). The $CoSi_2$ is a low resistance conductor and has a thickness slightly greater than of the CoSi layer (300 Å to 400 Å in this example).

Even though a preclean is performed, in practice the surface of the silicon 1 is covered by a native oxide with a thickness typically about 5 Å to 10 Å. This oxide is shown as layer 11 in FIG. 3A. When the Co layer 2 is deposited on top of the oxide 11, Co and Si atoms diffuse toward each other through the oxide, as shown schematically in FIG. 3B. After the first anneal, layers of CoSi 12, 13 are formed above and below the oxide, respectively (FIG. 3C; compare with the idealized picture in FIG. 1B). The thin native oxide does not interfere with the reaction between the Co and the Si to form the silicide.

As noted above, the conventional TiN in capping layer 3 is generally not truly stoichiometric, but includes additional nitrogen. Nitrogen atoms may thus diffuse out of the capping layer 3 into and through the cobalt layer 2. In addition, N may be incorporated in the Co layer or at the Co/TiN interface during deposition of the capping layer. Although possible beneficial effects of introducing nitrogen into a self-aligned $CoSi_2$ are known (for example, improving thermal stability to agglomeration), the involvement of nitrogen in the cobalt silicide formation process has an undesirable effect. Specifically, diffusion of N atoms from the TiN capping layer 3 to the oxide layer 11 (see FIG. 4A) may result in formation of an oxynitride layer 21, which blocks diffusion of Si atoms 10 to the cobalt layer 2 (FIG. 4B; compare FIG. 3B). A thick oxynitride may also inhibit transport of Co atoms. This results in incomplete formation of the CoSi, with a layer 22 of unreacted Co above the oxynitride 21 after the first anneal (FIG. 4C; compare FIG. 3C). This Co layer 22 is stripped away with the TiN capping layer 3, leaving a thin layer of CoSi. This in turn results in a thin layer 25 of $CoSi_2$ being formed in the second anneal (FIG. 4D). Discontinuities in the $CoSi_2$ layer 25 (that is, incomplete coverage of the Si gate 1) have been observed.

There is therefore a need for a capping layer for the cobalt metal which in general controls the introduction of N into the cobalt prior to formation of the $CoSi_2$, and in particular avoids formation of an oxynitride between the cobalt and silicon, thereby permitting complete formation of the CoSi

SUMMARY OF THE INVENTION

The present invention addresses the above-described need by providing a capping layer for the silicide-forming metal such that nitrogen diffusion therefrom is insufficient to cause formation of an oxynitride from the oxide layer on the silicon.

According to a first aspect of the invention, the capping layer is a metal layer overlying the semiconductor structure and in contact with the silicide-forming metal; this metal layer is composed of tungsten, molybdenum, tantalum or another refractory metal. If the layer is of tungsten, the thickness thereof is approximately in the range 25 Å to 150 Å.

According to another aspect of the invention, the capping layer is a layer of nitride, such as titanium nitride (TiN), overlying the semiconductor structure and in contact with the silicide-forming metal, where the layer has a nitrogen content such that diffusion of nitrogen from that layer through the silicide-forming metal is prevented. Specifically, this nitride layer may be non-stoichiometric TiN deficient in nitrogen. Accordingly, the diffusion of nitrogen from the nitride layer is insufficient to cause formation of an oxynitride at the oxide layer on the silicon surface.

According to another aspect of the invention, the capping layer has a first layer in contact with the silicide-forming metal, and a second layer overlying the first layer and in contact therewith; the second layer has a composition distinct from that of the first layer. Each of these layers preferably includes titanium. Specifically, the first layer may be titanium nitride (TiN) including a first amount of nitrogen, while the second layer is TiN including a second amount of nitrogen greater than the first amount. The first and second layers each have a thickness of approximately 100 Å. These distinct TiN layers may be produced by sputtering Ti in the presence of $N_2$ flows in regions I and III respectively, thereby producing N-deficient and N-rich TiN layers. Alternatively, the first layer may consist essentially of Ti and with a thickness not greater than about 20 Å, while the second layer comprises TiN having a thickness of approximately 200 Å. As another alternative, the second layer may consist essentially of Ti with a thickness of approximately 200 Å, while the first layer comprises TiN. to a further aspect of the invention, a method is provided for forming a capping layer for a semiconductor structure, where the semiconductor structure includes a silicide-forming metal overlying silicon. The method includes the step of forming a layer of nitride overlying the semiconductor structure and in contact with the silicide-forming metal; the layer has a nitrogen content such that diffusion of nitrogen from the layer through the silicide-forming metal is prevented. The layer of nitride is preferably titanium nitride. The forming step may include sputtering from a titanium target in an ambient characterized by a nitrogen flow, where the nitrogen flow is insufficient to cause formation of a nitride on the target; accordingly, the layer of nitride comprises non-stoichiometric TiN deficient in nitrogen.

According to an additional aspect of the invention, the method may include the steps of forming a first layer and a second layer, with the first layer and second layer having distinct compositions. The step of forming the first layer may include sputtering from a titanium target in an ambient characterized by a nitrogen flow, where the nitrogen flow is insufficient to cause formation of a nitride on the target; accordingly, the first layer may be non-stoichiometric TiN deficient in nitrogen. Alternatively, the step of forming the first layer may include sputtering from a titanium target to produce a layer consisting essentially of titanium, while the step of forming the second layer includes sputtering from a titanium target in an ambient characterized by a nitrogen flow where the nitrogen flow is sufficient to cause formation of a nitride on the target, to produce a layer of titanium nitride. As another alternative, the steps may be performed to produce a first layer of titanium nitride, and a second layer consisting essentially of titanium.

DESCRIPTION OF THE DRAWINGS

FIGS. 3A–3C are schematic views illustrating formation of a cobalt silicide layer when a native silicon oxide layer is present.

FIGS. 4A–4D illustrate the problem of incomplete formation of a cobalt silicide layer when N diffusion from a TiN capping layer occurs and an oxynitride is formed on the surface of the silicon gate.

DETAILED DESCRIPTION OF THE PREFERRED EMBODIMENTS

In accordance with the present invention, the conventional TiN capping layer 3 is replaced by (1) a metal layer from which no N diffusion occurs, or (2) one or more layers including Ti and/or TiN arranged so that N atoms do not reach the oxide layer 11, thereby avoiding formation of oxynitride layer 21.

First Embodiment: Tungsten Capping Layer

Figure 5A:
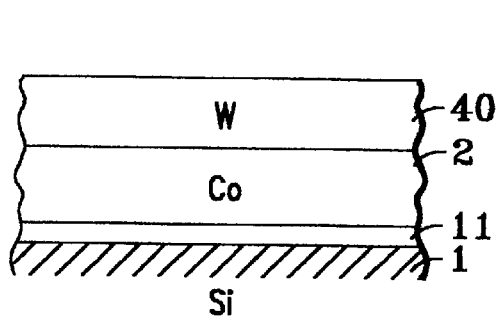
FIGS. 5A–5D illustrate formation of a cobalt silicide layer on the gate structure when a tungsten capping layer is used, according to a first embodiment of the invention.
Figure 5B:
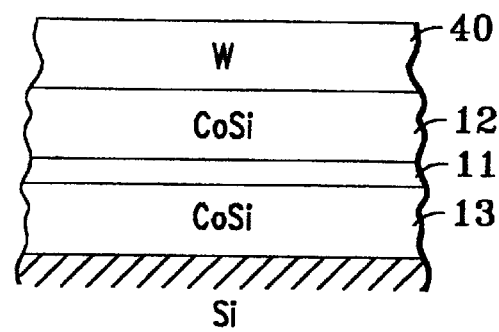
Figure 5C:
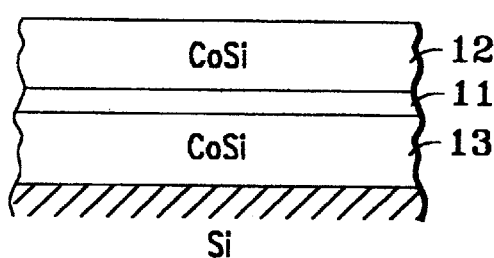
Figure 5D:
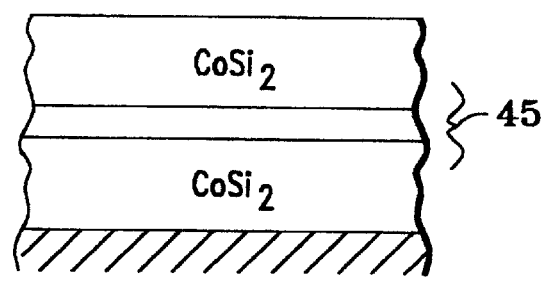

In this embodiment, a capping layer 40 of tungsten is deposited over the cobalt layer 2 (FIG. 5A). The W layer has a thickness approximately in the range 25–150 Å, preferably about 75 Å. It should be noted that this thickness is generally less than that of the TiN capping layer 3, to avoid excess stress on the underlying Co layer. The W cap does not permit incorporation of nitrogen into the Co layer 2 or the native oxide 11, so that diffusion of both Co and Si occurs and CoSi is formed above and below the oxide following the first anneal (FIG. 5B; compare FIG. 3C). After the W capping layer is removed (FIG. 5C) and the second anneal is performed, a $CoSi_2$ layer 45 of the desired thickness is left on the Si surface (FIG. 5D). Since N diffusion from the capping layer is avoided, unreacted Co on top of the silicide is likewise avoided. Additional possible materials for the capping layer include molybdenum, tantalum and other refractory metals.

Second Embodiment: N-deficient TiN Capping Layer

Figure 1A:
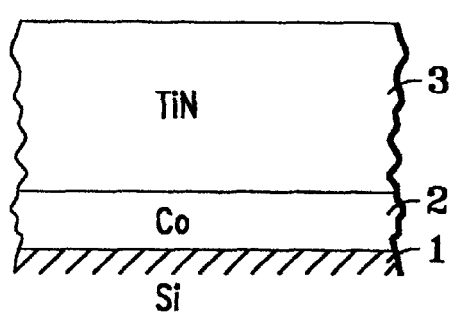
FIGS 1A–1C are schematic views of a gate structure, illustrating formation of a cobalt disilicide layer thereon when a TiN capping layer is used.
Figure 1B:
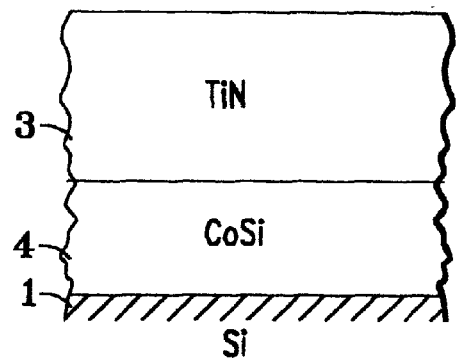
Figure 1C:
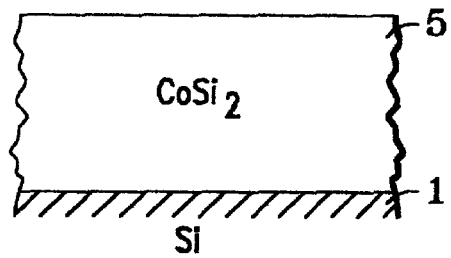
Figure 2:
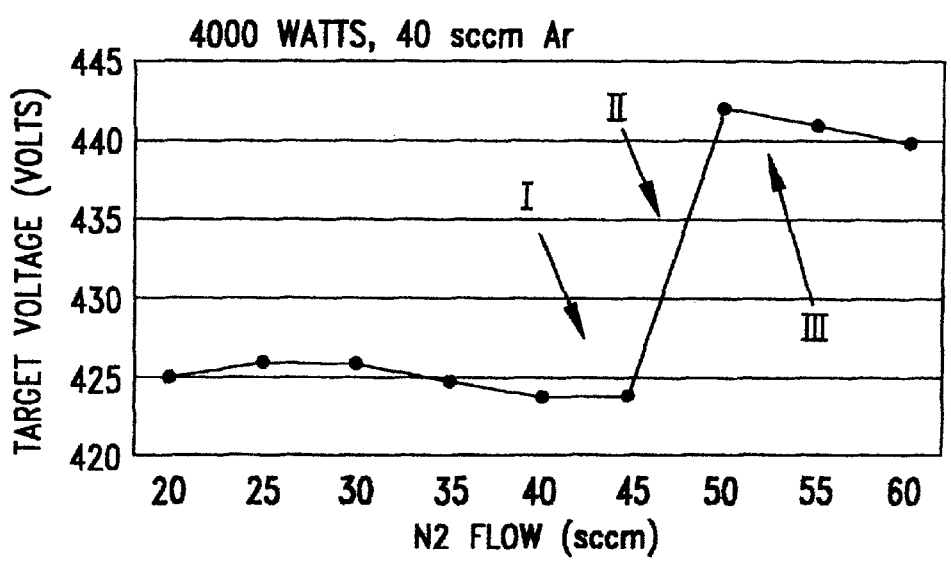
FIG. 2 is a graph illustrating the relationship between target voltage and $N_2$ flow when Ti is sputtered, with distinct regions of $N_2$ flow where sputtering occurs from a non-nitrided target and a nitrided target.
Figure 6A:
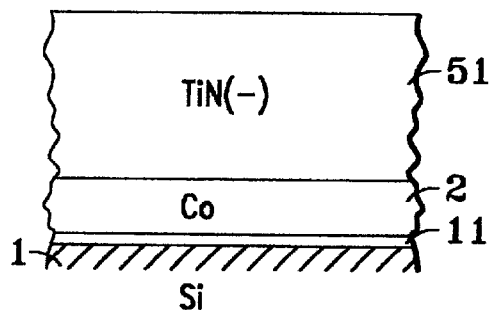
FIGS. 6A and 6B illustrate the use of a nitrogen-deficient TiN capping layer, according to a second embodiment of the invention.
Figure 6B:
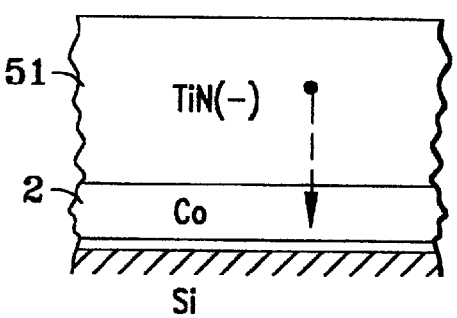

As discussed above with reference to FIG. 2, the nitrogen content of a TiN capping layer may be controlled by adjusting the $N_2$ flow in the Ti sputtering chamber, thereby controlling the ambient in which Ti is sputtered onto the surface of Co layer 2. In this embodiment, a capping layer 51 is formed which has N-deficient TiN; that is, Ti is sputtered $N_2$ flow in region I of FIG. 2, so that the amount of nitrogen included in the capping layer is less than in a conventional TiN layer (which is sputtered from a nitrided Ti target with $N_2$ flow in region III). The N-deficient TiN is shown in FIG. 6A as TiN(-); layer 51 preferably has a thickness of about 200 Å. Accordingly, less N is available to diffuse through the Co than in the case of conventional TiN, so that diffusion from layer 51 through the Co layer is reduced and an oxynitride is not formed (see FIG. 6B). As a result, a CoSi layer with the desired thickness is formed after the first anneal (as in FIG. 3C).

Third Embodiment: TiN Bi-layer

Figure 7A:
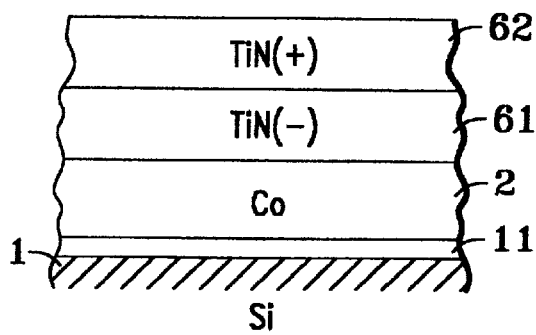
FIGS. 7A and 7B illustrate the use of a bi-layer TiN cap, according to a third embodiment of the invention.
Figure 7B:
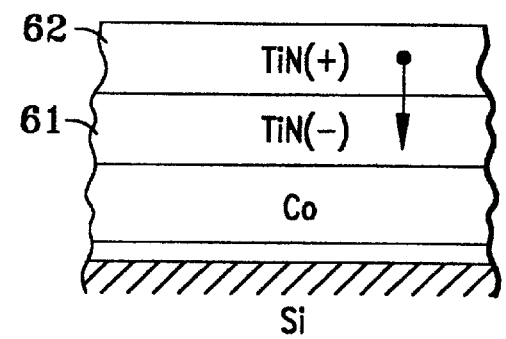

In this embodiment, a TiN capping layer is formed which comprises two layers, as shown in FIG. 7A. A nitrogen-deficient TiN layer 61 is deposited on the Co layer 2, and a nitrogen-rich TiN layer 62 is deposited thereon. The N-rich TiN material is indicated TiN(+) in FIG. 7A. Layers 61 and 62 are obtained by sputtering Ti in regions I and III of FIG. 2, respectively. Layers 61 and 62 have thicknesses of approximately 100 Å each. This arrangement permits nitrogen atoms diffusing from layer 62 to be absorbed in layer 61, so that N diffusion to the oxide 11 (and subsequent formation of an oxynitride) is avoided (FIG. 7B). The cobalt in layer 2 then may react with Si to form CoSi, as described above.

Fourth embodiment: TiN/Ti Combination Capping Layer

Figure 8A:
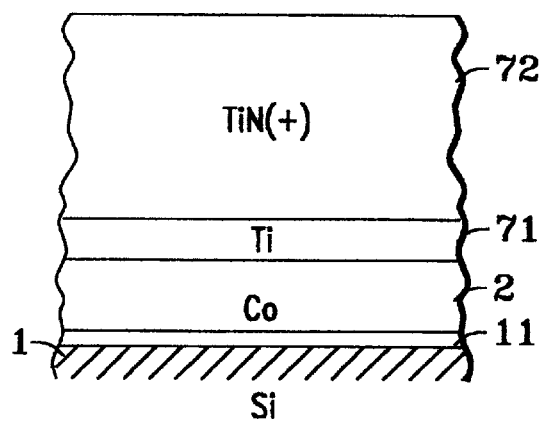
FIGS. 8A and 8B illustrate the use of a TiN/Ti combination capping layer, according to a fourth embodiment of the invention.
Figure 8B:
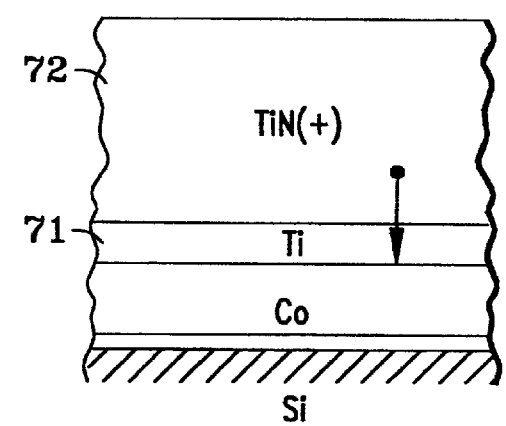

In this embodiment, the capping layer is a combination of two distinct layers: (1) a layer 71 of pure Ti deposited on the cobalt, preferably with a thickness less than 20 Å; and (2) a layer 72 of N-rich TiN, preferably with a thickness of about 200 Å (see FIG. 8A). The thickness of layer 71 must be limited, in order to minimize reaction between the Ti and the CoSi when the latter is formed following the first anneal. This arrangement permits nitrogen atoms diffusing from layer 72 to be absorbed in layer 71, as shown schematically in FIG. 8B. Nitrogen is thus prevented from reaching the interface between Co layer 2 and Ti layer 71. Accordingly, an oxynitride does not form on the Si surface, and the problem of unreacted Co does not arise.

Fifth Embodiment: Ti/TiN Combination Capping Layer

Figure 9A:
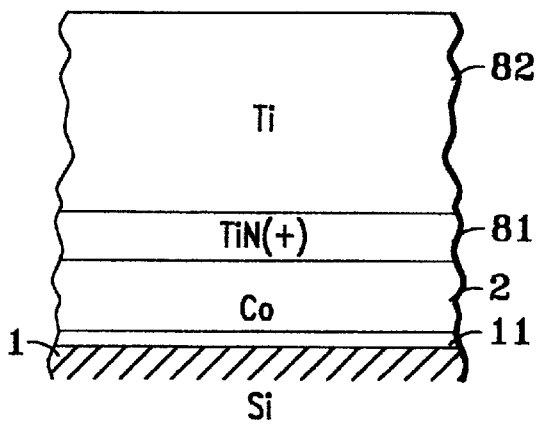
FIGS. 9A and 9B illustrate the use of a Ti/TiN combination capping layer, according to a fifth embodiment of the invention.
Figure 9B:
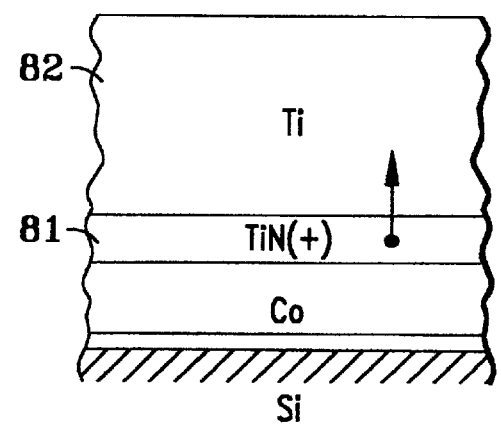

The capping layer of this embodiment comprises a combination of (1) a nitrogen-rich TiN layer 81 and (2) a layer 82 of pure Ti deposited thereon (FIG. 9A). Layer 81 preferably has a thickness less than about 50 Å, while the thickness of layer 82 is approximately 200 Å. The thickness of the TiN(+) film 81 is chosen to provide sufficient adhesion to the underlying Co layer without excess stress, while limiting the amount of nitrogen available to form an oxynitride in oxide layer 11. Nitrogen atoms diffusing from the TiN(+) layer 81 will be absorbed in the Ti layer 82 (see FIG. 9B), so that less N is available to diffuse into and through the cobalt layer 2. Accordingly, formation of an oxynitride is avoided.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

We claim:

1. A capping layer for a semiconductor structure, the semiconductor structure including a silicide-forming metal overlying silicon, the capping layer comprising:

a first layer of nitride overlying the semiconductor structure and in contact with the silicide-forming metal, where the layer is a nitrogen-deficient layer characterized by being formed by sputtering in an atmosphere having a nitrogen flow less than about 45 sccm and from a target on which a nitride is not formed.

2. A capping layer according to claim 1, wherein the layer is a single layer of titanium nitride having a thickness of about 200 Å.

3. A capping layer for a semiconductor structure, the semiconductor structure including a silicide-forming metal overlying silicon, the capping layer comprising:

a first layer in contact with the silicide-forming metal, said first layer being a nitrogen-deficient nitride layer characterized by being formed by sputtering in an atmosphere having a nitrogen flow less than about 45 sccm and from a target on which a nitride is not formed; and a second layer overlying said first layer and in contact therewith, said second layer having a composition distinct from that of said first layer, said second layer being a nitrogen-rich nitride layer characterized by being formed by sputtering in an atmosphere having a nitrogen flow greater than about 45 sccm.

4. A capping layer according to claim 3, wherein said first layer is titanium nitride (TiN) including a first amount of nitrogen, and said second layer is TiN including a second amount of nitrogen greater than the first amount.

5. A capping layer according to claim 3, wherein said first layer and said second layer each have a thickness of approximately 100 Å.

6. A capping layer for a semiconductor structure, the semiconductor structure including a silicide-forming metal overlying silicon, the capping layer comprising:

a first layer in contact with the silicide-forming metal, said first layer being a nitrogen-rich nitride layer characterized by being formed by sputtering in an atmosphere having a nitrogen flow greater than about 45 sccm, said first layer having a thickness less than about 50 Å; and a second layer overlying said first layer and in contact therewith, wherein said second layer consists essentially of Ti and has a thickness of approximately 200 Å, and said first layer comprises TiN.

* * * * *